Figure 1:
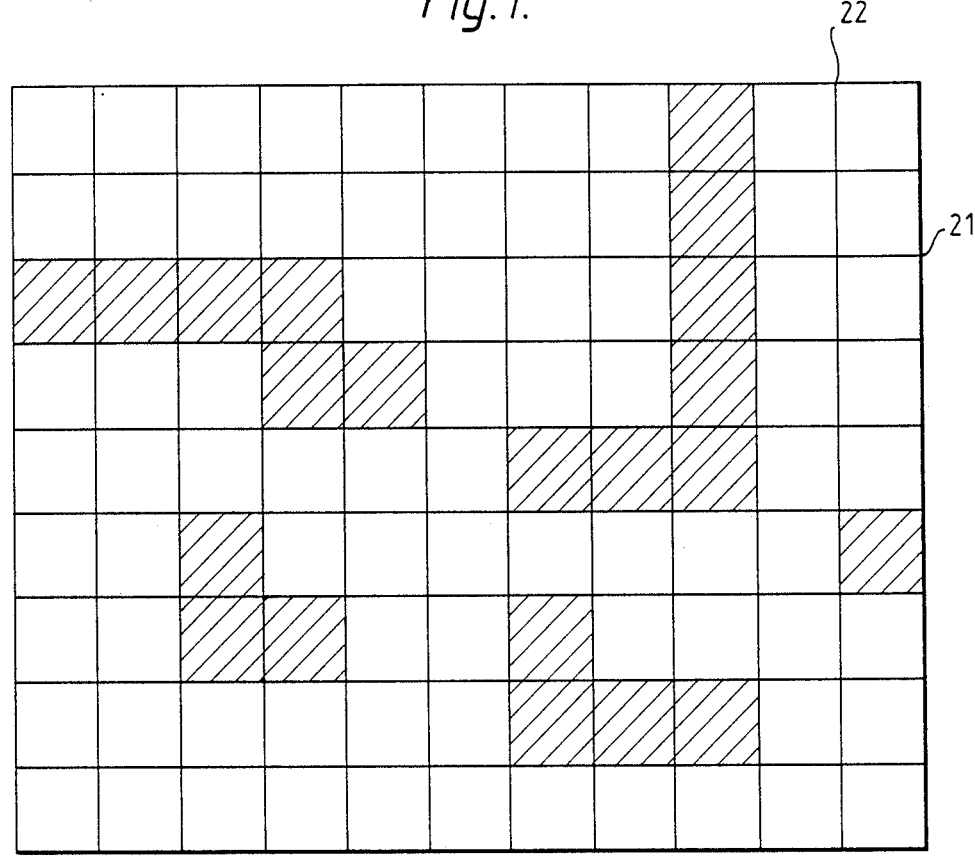

United States Patent [19]

McCaughan

[11] Patent Number: 4,803,178
[45] Date of Patent: Feb. 7, 1989

[54] METHOD OF MAKING SILICON-ON-SAPPHIRE GATE ARRAY

[75] Inventor: Daniel V. McCaughan, Lincoln, England

[73] Assignee: Marconi Electronic Devices Limited, England

[21] Appl. No.: 126,562

[22] Filed: Nov. 30, 1987

[30] Foreign Application Priority Data

Dec. 4, 1986 [GB] United Kingdom ................ 8629040

[51] Int. Cl.[4] .................. H01L 21/225; H01L 21/308
[52] U.S. Cl. ........................................ 437/51; 437/84; 437/203; 437/65; 148/DIG. 150
[58] Field of Search .............. 357/45, 40, 47; 437/51, 437/83, 84, 65, 203; 148/DIG. 150

[56] References Cited

U.S. PATENT DOCUMENTS

| | | |
|---|---|---|
| 3,634,929 | 1/1972 | Yoshida et al. ............... 437/51 |
| 3,674,552 | 7/1972 | Heywang et al. ............. 437/84 |
| 3,835,530 | 9/1974 | Kilby ............................ 437/51 |
| 4,075,756 | 2/1978 | Kircher et al. ............... 437/51 |
| 4,201,603 | 5/1980 | Scott, Jr. et al. ............. 437/84 |
| 4,278,897 | 7/1981 | Ohno et al. ................... 357/40 |
| 4,482,810 | 11/1984 | Cooke ........................... 357/45 |
| 4,701,860 | 10/1987 | Mader ........................... 437/51 |

OTHER PUBLICATIONS

Lambert, R., "Silicon on Sapphire Technology" IEE Tutorial Meeting on Silicon on Insulator-Current Status and Future Potential, (Dig. No. 75), 2/1–4, Mar. 1987.
Turmaine, B., "Commercial Use for SOI Chips" Electron. Weekly, No. 1373, p. 22, Jul. 15, 1987.

Primary Examiner—Brian E. Hearn
Assistant Examiner—Tom Thomas
Attorney, Agent, or Firm—Kirschstein, Kirschstein, Ottinger & Israel

[57] ABSTRACT

A semiconductor arrangement has a substrate which carries a partially filled array of semiconductor cells, and utilises the vacant sites in the array to position interconnecting tracks. A filled array is manufactured, and when the electrical function of the arrangement has been allocated, those semiconductor cells, each of which contains active semiconductor devices, which are not needed to perform the allocated function are removed. The vacant sites so formed are then occupied by electrically conductive tracks. The arrangement is suitable for silicon-on-sapphire gate arrays.

6 Claims, 1 Drawing Sheet

METHOD OF MAKING SILICON-ON-SAPPHIRE GATE ARRAY

This invention relates to a semiconductor arrangement of the kind which consists of a large number of individual elements formed in or on a common substrate. Such devices are generally tered gate arrays, as the individual elements are often logic devices or switches. When a large number of individual elements are formed in a common body of semiconductor material such as silicon, it is generally necssay to space the individual elements apart somewhat so as to reduce the likelihood of undesired leakage currents occurring between them through the body of the semiconductor material during operation.

The packing density of the elements in a gate array can be increased by forming them as discrete isolated islands of semiconductor material formed upon an insulating substrate. At the present time such an arrangement typically consists of small islands of epitaxial silicon supported upon a common substrate of sapphire, which is an inert insulating material having a temperature coefficient and a cystal structure which is compatible with that of silicon. In order to provide electrical interconnections between the individual elements it is customary to either space element apart in rows so as to leave relatively wide channels between them in which the electrical tracks can be located, or alternatively to run the electrical tracks over semiconductor elements which are sacrificed for this purpose. In the latter case, additional processing difficulties are introduced owing to the need to maintain electrical continuity of a conductive track as it passes over the steep side wall of the localised islands of semiconductor material. The former alternative largely negates the merit of providing a gate array with a large packing density of logic elements since a large amount of the available surface area is allocated in advance for the purpose of electrical interconnections, and sufficient space must be made available for functions which might be allocated to the arrangement. The present invention seeks to provide an improved semiconductor arrangeent.

According to a first aspect of this invention a semiconductor arrangement includes an insulating planar substrate carrying a regularly ordered array of semiconductor cells in which a proportion of the cells are omitted to constitute a partially filled arry and a complementay distribution of vacant sites; and a pattern of conductive tracks serving to interconnect the cells which constitute the array, the tracks at least partially traversing said vacant sites.

According to a second aspect of this invention a method of making a semiconductor arrangement includes the steps of forming a closely packed regular array of semiconductor island cells, each cell of which includes a semiconductor device and is formed on an insulating substrate; removing selected cells to leave a partially filled array; and forming electrically conductive interconnections for remaining cells, the interconnections at least partly overlying the sites of the removed cells.

Thus for a given size of insulating substrate it can in principle cary the aximum number of cells arranged as a closely packed array, each cell of which may contain a plurality of semiconductor devices formed in an island of semiconductor aterial which is proud of the surface of the subrate. The spacing between adjacent cells need be only sufficient to ensure good electrical isolation between them, and in practice this can be very small indeed providing that the substrate chosen is a vey good insulator and its surface is sufficiently clean or passivated. Once a completed array of semiconductor cells has been formed but not interconnected, it is preferably covered with an inert lyer of insulating material, typically an oxide of silicon or the like. The completed array can then be stored until needed. At this stage the semiconductor arrangement will not have an allocated function but will be of a general purpose nature and consists of a copletely filled regular array. When the function hich the gate array has to perform has been located to the semiconductor arrangeent those cells which permit this function to be achieved %n a ost efficient or convenient anner are selected for retention, and cells occupying sites which are needed to permit interconnection to the selected cells are then discarded. These cells are removed, typically by eans of a suitable chemical or plasma etching process so as to leave the vacant sites as a smooth flat surface having no major or abrupt steps upon it., Typically the semiconductor material will be removed completely at these sites to expose the original flat surface of the planar substrate. This flat surface is eminently suitable for carrying conductive tracks, particularly double layer interconnection patterns, with the minimum of processing complexity.

The vacant sites which are utilised for the interconnection patterns can be chosen so as to permit the most efficient use of the available arry of gates, and the layout of retained cells and the pattern of vacant sites can be optimised for each different circuit requirement or function. This approach permits a ost efficient utilisation of the available number of individual semiconductor cells to be achieved, whilst avoiding the need for complex or unreliable interconnection techniques.

The invention is further described by way of example with reference to the accompaying drawing in which:

FIG. 1 illustrates a partially filled regular gate array, and

Figure 2:
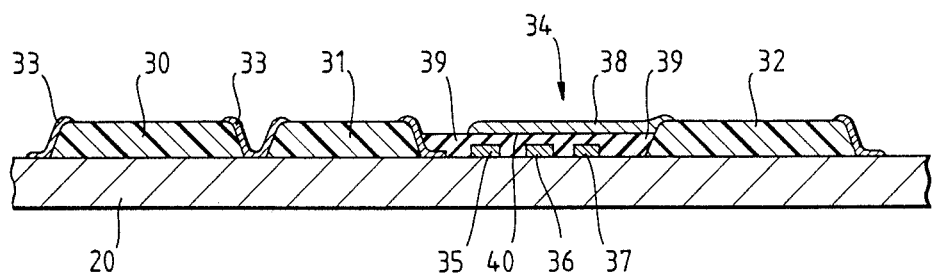

FIG. 2 which illustrates a section through a small portion of such an array.

Referring to FIGS. 1 and 2, there is shown therein a substrate 20 of sapphire upon which a sea of gates of silicon have been formed. Gate arrays having fully filled arrays are now well known and it is not thought necessary to describe in detail the way in which a pattern of discrete island cells of epitaxial silicon is formed upon an insulating substrate such as sapphire. Briefly, a cleaned flat planar substrate of sapphire is used as the base upon which epitaxial silicon is grown by vapour deposition from a suitable gas. The cystal structure of the sapphire is sufficiently similar to that of mono-crystalline silicon to encourage the correct formation of the crystal structure within the layer of epitaxial silicon as it is grown. Although it may not form a perfectly regular structure at the plane of contact with the sapphire, nevertheless the quality of the cystal structure of the epitaxial silicon increases with thickness and achieves an acceptably good degree of regularity if the layer is sufficiently thick.

Logic arrays consisting of large numbers of field effect transistors, and resistors can be formed within the epitaxial silicon by conventional and well-known semiconductor processing-techniques involving masking and diffusion. When each cell has been completed and the fabrication of the semiconductor devices within it has been finalised longitudinal grooves are etched through the epitaxial silicon along the lines 21 and 22 to divide the layer of epitaxial silicon into a large number of small electrically separate islands which are electrically isolated from each other by the sapphire substrate on which they stand. Following completion of this step the whole of the silicon surface and the upper surface of the sapphire are covered with a passivation layer, typically one based on an oxide of silicon. With this inert passivation layer in place the semiconductor arrangement can be stored as needed without deterioration of its electrical properties.

In principle gate arrays are general purpose devices, and their functions are determined priarily by the way in which the individual gates are interconnected and the way in which external interconnections are made. Thus a given gate array can be made to perform a very wide variety of different electrical functions. It is desirable to make the most efficient use of the available semiconductor devices which make up the array so as to avoid unnecessary waste.

In accordance with the present invention, selected cells of the semiconductor arrangement are removed to make way for electrical interconnect patterns, the routes of which are chosen once the function of the semiconductor arrangement has been allocated. In general the interconnection pattarn will be chosen so as to optimise the grouping of the operational cells which remain in the partially filled array, and typically blocks of adjacent cells would contribute to a common processing function or the like. In FIG. 1 the shaded rectangles represent the vacant sites from which silicon islands have been removed to make way for the electrical interconnect pattern. Conveniently short rows or columns of vacant sites are formed penetrating deeply into the interior of the array so as to permit ready and convenient electrical access to the innermost used cells. A vacant site surrounded by operational cells can conveniently be used as a common electrical connection point.

In FIG. 2 the substrate 20 of sapphire is shown supporting just three localised islands 30, 31 and 32 of silicon, although of course many more would be present in practice. The passivating layer of insulating material is not shown but the electrical interconnection tracks 33 are illustrated. The vacant site 34 is shown as being occupied by three longitudinally disposed electrical interconnection tracks 35, 36 and 37 and by a covering track 38 which is separated by a thin insulating layer 39 Such an arrangement is termed a double layer etallisation as the tracks are invariably metal. A link 40 extends through the layer 39 to electrically connect the two layers of metallisation. Because these tracks typically of aluminium or gold are formed upon a flat substrate, their fabrication is relatively simple and straightforward. In practice a double level interconnect is widely used. Thus the holes in the passivating layer above the remaining active cells would be formed and the double layer metallisation interconnect pattern formed as a subsequent step.

I claim:

1. A method of making a semiconductor arrangement including the steps of forming a closely packed regular array of semiconductor island cells, each cell of which includes a semiconductor device and is formed on an insulating substrate; removing selected cells to leave a partially filled array; and forming electrically conductive interconnections for remaining cells, the interconnections at least partly overlying the sites of the removed cells.

2. A method as claimed in claim 1 and wherein the selected cells are removed to expose the surface of the insulating substrate.

3. A method as claimed in claim 3 and wherein said electrically conductive interconnections take the form of metallic tracks in contact with the surface of said substrate to constitute a first layer of interconnection.

4. A method as claimed in claim 3 and wherein a second layer of interconnection is produced by forming another layer of metallic tracks on an electrically insulating layer which overlies said first layer of interconnection.

5. A method as claimed in claim 2 and wherein following the formation of the closely packed regular array of semiconductor island cells, the cells are coated with a passivating layer of an inert electrically insulating material.

6. A method as claimed in claim 5 and following the allocation of a circuit function to said arrangement, and the removal of said selected cells, apertures are opened in said passivating lyer to permit electrical connection between remaining cells and the electrically conductive interconnections.

* * * * *